(12) United States Patent
Morgan et al.

(10) Patent No.: US 6,788,228 B2
(45) Date of Patent: Sep. 7, 2004

(54) ADDRESSING DEVICE FOR SELECTING REGULAR AND REDUNDANT ELEMENTS

(75) Inventors: Alan Morgan, München (DE); Helmut Fischer, Oberhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/364,014

(22) Filed: Feb. 10, 2003

(65) Prior Publication Data

US 2003/0156477 A1 Aug. 21, 2003

(30) Foreign Application Priority Data

Feb. 8, 2002 (DE) ......................................... 102 05 196

(51) Int. Cl.[7] .............................................. H03M 7/00
(52) U.S. Cl. .................................... 341/78; 365/230.01
(58) Field of Search ........................... 341/78, 121, 50; 365/200, 202, 230.01

(56) References Cited

U.S. PATENT DOCUMENTS 4,724,135 A * 2/1988 Cirjak et al. ............. 423/594.1
6,101,135 A * 8/2000 Lee ............................. 365/191
6,567,322 B1 * 5/2003 Mukai et al. ................ 365/200

* cited by examiner

Primary Examiner—Peguy JeanPierre
(74) Attorney, Agent, or Firm—Laurence A. Greenberg; Werner H. Stemer; Ralph E. Locher

(57) ABSTRACT

An addressing device selects an element from a set of $N \leq 2^K$ regular elements or alternatively from a set of R<N redundant elements in dependence on a K-bit input address which is applied to a 1-out-of-N decoder, and which addresses the regular elements. For each redundant element, a bypass circuit is provided and has in each case a reference bit transmitter for supplying K reference bits that are programmable by selective destruction or by selective introduction of conductive links in order to set a comparison device to the identification of a selected address. If the relevant address is identified, the bypass circuit addresses the redundant element assigned to it while switching off the 1-out-of-N decoder, provided that it is sensitized. For its sensitization, each bi-stable-circuit checks M<K preselected specimens of the reference bits in order to set the relevant bypass circuit into an active state if the binary values of these reference bits differ from a chosen bit combination.

8 Claims, 5 Drawing Sheets

ADDRESSING DEVICE FOR SELECTING REGULAR AND REDUNDANT ELEMENTS

BACKGROUND OF THE INVENTION

Field of the Invention

The invention relates to a device for addressing an arbitrary element from a set of $N \leq 2^K$ regular elements or alternatively an element from a set of $R<N$ redundant elements depending on the binary values of the address bits of a K-bit input address. The address device has a 1-out-of-N decoder, which has K address inputs for receiving the address bits and N outputs for connection to the N regular elements. The device further has R bypass circuits, each of which is assigned to precisely one redundant element. The bypass circuits each have a sensitization circuit for setting the relevant bypass circuit into an active state, a reference bit transmitter for supplying K reference bits which are individually assigned to the K address bits and whose values are programmable by selective destruction or preservation of conductive links or by selective introduction of conducting links, a comparison device which derives K comparison bits from the reference bits and compares them with the respectively assigned address bits and supplies a hit information item if the address bits correspond to a bit combination which is unambiguously related to the bit combination of the comparison bits, and a control circuit, which, upon the appearance of the hit information item, supplies a selection signal which switches off the 1 out-of-N decoder and addresses the assigned redundant element if the relevant bypass circuit is set into the active state. A preferred, but not exclusive, area of application for the invention is the addressing of rows or columns of a memory matrix.

In assemblies that contain a multiplicity of selectively addressable elements and a corresponding addressing device, the functional test carried out after production may reveal that one or more of the elements are defective. Since the direct repair of a defective element is too complex or even impossible in many cases, at least one additional "redundant" element is provided besides the required number of regular elements as early as during the production of the assembly, which element can serve, as required, as a replacement for a defective element. The number R of redundant elements to be provided is usually less than the number N of regular elements and is dimensioned taking account of the maximum expected defect frequency. All of the redundant elements present are, of course, likewise subjected to a functional test.

The addressing of the elements is typically effected digitally by a multi-bit address using a 1-out-of-N decoder contained in the addressing device, where N is the number of regular elements. If it is desired to fully utilize the available address array, an integer power of 2 is chosen for the number N, that is to say $N=2^K$, where K is the number of bits of the input address for the 1-out-of-N decoder.

In order to replace each defective regular element in a system by a respective defect-free specimen of the R redundant elements, manipulations are performed at the addressing device after the test in order to ensure that, upon the appearance of the input address for a defective regular element, the 1-out-of-N decoder is switched off and the addressing is "bypassed" to a respectively selected element of the R redundant elements. For this purpose, the addressing device is additionally provided with R bypass circuits, each of which leads to one of the redundant elements and contains a programmable reference bit transmitter and also a comparison and control logic. Each reference bit transmitter contains a device for providing K bits that can be arbitrarily programmed after the production of the system in order to prescribe a K-bit comparison address. The assigned bypass circuit compares the address with the input address. In the event of correspondence, it switches off the 1-out-of-N decoder and addresses the redundant element assigned to it.

Once the functional test of the assembly has shown which regular and redundant elements are defective, the addresses of the defective regular elements are programmed into the reference bit transmitters. For this purpose, it is possible, of course, to select the reference bit transmitters only of those bypass circuits which lead to defect-free redundant elements. After the programming, it is ensured that when an input address corresponding to a defective element is applied, the 1-out-of-N decoder is inactive, and that the defect-free redundant element selected for this address is addressed instead.

It is generally customary for the reference bit transmitters to be configured in such a way that they can be programmed by so-called "fuse" technology. For this purpose, the K circuit nodes of each reference bit transmitter, at which the K bits of the comparison address are supplied, are connected to a first of the two logic potentials L or H, which represent the binary values "0" and "1", via a respective destructible conductive link. Moreover, each of the circuit nodes is connected to the respective other logic potential via a second branch. The configuration is dimensioned in such a way that the circuit node is pulled to the first logic potential in the case of an undestroyed link and is pulled to the other logic potential when the link is destroyed. The links are usually low-value resistors which can be selectively fused e.g. by a laser beam or applied over-voltage (so-called fusible links or "fuses").

Each reference bit transmitter of the type described above can thus be programmed to an arbitrary K-bit address by destruction or preservation of selected specimens of its links in order to ensure that the addressing of the regular element which is normally assigned to the address is bypassed to the redundant element which is assigned to the relevant reference bit transmitter. Even if none of the links in a reference bit transmitter is destroyed, there is a programming to a K-bit address. This would be e.g. the zero address if all the links lead to that logic potential which represents the binary value "0". Thus, a programming state that would not correspond to some of the N input addresses is not possible for a reference bit transmitter.

The above-mentioned functional test may reveal that no or not all the redundant elements are actually required as a replacement (because the number of defective regular elements is less than the number of redundant elements present) or that certain redundant elements are not permitted to be used as a replacement (because they are defective themselves). In these cases, the redundant elements that are not to be used must be prevented from being addressed in an undesirable manner via the assigned bypass circuits. For this reason, a separate sensitization circuit must be provided for each bypass circuit in order that the bypass circuit is put into a active state only when a decision has been taken on account of the functional test that the assigned redundant element is actually to be used as a replacement element.

In the prior art, the above-mentioned sensitization circuits are realized in each case by an addition, superordinate fusible link ("master fuse") in each bypass circuit. Each of these additional links can be destroyed selectively, in the same way as the other links in the reference bit transmitters. Each additional link is typically disposed in such a way that the relevant bypass circuit can operate only when the additional link is destroyed.

The use of the above-mentioned additional links in accordance with the prior art has disadvantages. This is because destructible links require much space and cannot be miniaturized to the same extent as other circuit components. On the one hand, such a link, particularly if, as is customary, it is formed by a fusible low-value resistor, already takes up a relatively large area for itself. On the other hand, it is necessary to comply with a relatively large distance between the fusible links and also from other circuit sections in order that a targeted destructive access is readily possible without influencing adjacent components. These space requirements lead to problems and various restrictions in particular in the realization of integrated circuits.

SUMMARY OF THE INVENTION

It is accordingly an object of the invention to provide an addressing device for selecting regular and redundant elements that overcomes the above-mentioned disadvantages of the prior art devices of this general type, which requires fewer links than before.

With the foregoing and other objects in view there is provided, in accordance with the invention, an addressing device for selecting an element from one of a set of $N \leq 2^K$ regular elements and a set of $R<N$ redundant elements depending on binary values of address bits of a K-bit input address. The addressing device contains a 1-out-of-N decoder having K address inputs receiving the address bits and N outputs coupled to the N regular elements, and R bypass circuits each coupled to precisely one of the redundant elements. The R bypass circuits are each coupled to the 1-out-of N decoder and each contains a sensitization circuit for setting a respective bypass circuit into an active state, and a reference bit transmitter having programmable links and supplying K reference bits individually assigned to the K address bits and values of the K reference bits being programmable by programming the programmable links. The programmable links are fuses or anti-fuses, and the reference bit transmitter is coupled to the sensitization circuit. The bypass circuit further has a comparison device connected to the reference bit transmitter and derives K comparison bits from the reference bits. The comparison device compares the comparison bits with the address bits and supplies a hit information item if the address bits correspond to a bit combination unambiguously related to the comparison bits. A control circuit receives the hit information item, and upon receiving the hit information item the control circuit supplies a selection signal for switching off the 1-out-of-N decoder and addresses an associated redundant element if the respective bypass circuit is in the active state. The sensitization circuit receives $M \leq K$ preselected reference bits from the reference bit transmitter of the respective bypass circuit and sets the respective bypass circuit into the active state if binary values of the M preselected reference bits received differ from a chosen bit combination.

Accordingly, the invention is realized by the addressing device being configured for selecting the element from a set of $N \leq 2^K$ regular elements or alternatively an element from a set of $R<N$ redundant elements depending on the binary values of the address bits of a K-bit input address. The addressing device has the 1-out-of-N decoder, which has K address inputs for receiving the address bits and N outputs for connection to the N regular elements. The addressing device further has R bypass circuits, each of which is assigned to precisely one redundant element. The bypass circuits each contain a sensitization circuit for setting the relevant bypass circuit into an active state, a reference bit transmitter for supplying K reference bits which are individually assigned to the K address bits and whose values are programmable by selective destruction or preservation of conductive links or by selective introduction of conductive links, a comparison device for deriving K comparison bits from the K reference bits and compares them with the respectively assigned address bits and supplies a hit information item if the address bits correspond to a bit combination which is unambiguously related to the bit combination of the comparison bits, and a control circuit, which, upon the appearance of the hit information item, supplies a selection signal which switches off the 1-out-of-N decoder and addresses the assigned redundant element if the relevant bypass circuit is set into the active state. According to the invention, each sensitization circuit receives $M \leq K$ preselected reference bits from the reference bit transmitter of the relevant bypass circuit and sets the bypass circuit into the active state if the binary values of the M received reference bits differ from a bit combination chosen.

According to the invention, then, one of the $2^M$ possible combinations of values that the M preselected reference bits of a reference bit transmitter can represent or prescribe is chosen for keeping the bypass circuits deactivated. The "switch-off" bit combination can be chosen as desired, to be precise before the configuration of the addressing device in order that the logic circuits used are configured in an appropriate manner. If, after a test of the regular and redundant elements, a decision has arbitrarily been taken as to which of the defect-free redundant elements are intended to serve as a replacement for defective regular elements, the M preselected reference bits at the reference bit transmitters for the bypass circuits of the remaining redundant elements can be programmed to the switch-off bit combination (or remain unchanged if the original state of the reference bit transmitters is selected as switch-off bit combination), so that the relevant bypass circuits, and specifically only these, remain deactivated. All the other bypass circuits are automatically sensitized by the programming of the M preselected reference bits to combinations of values that differ from the switch-off bit combination. Consequently, the abovementioned additional links that are necessary specifically for the sensitization of the bypass circuits in the case of the prior art can be obviated.

It should be noted that, in an addressing device according to the invention, there are only $2^K-2^{K-M}$ bit combinations available for the programming of sensitized bypass circuits. It is thus possible, as required, to replace any arbitrary element of N regular elements by any arbitrary redundant element if N is not greater than $2^K-2^{K-M}$. There are applications in which this limitation of the number N should be tolerable, assuming that M is very close to K (e.g. equal to K or equal to K−1).

However, the addressing device according to the invention can also be configured in such a way that this limitation is obviated. A configuration in this respect consists in a device being provided in at least one of the bypass circuits, which device inverts at least one of the M preselected reference bits that are programmed in the assigned reference bit transmitter before it is applied to the comparison device, although the pattern of inversion must not be the same in all the bypass circuits. As will be explained in greater detail, it is possible by virtue of this measure to replace any arbitrary element of a total of N=$2^K$ regular elements by an arbitrary element of, in each case, a plurality of redundant elements.

In accordance with an added feature of the invention, the M preselected reference bits are assigned to the same M address bits at each the sensitization circuit.

In accordance with an additional feature of the invention, the comparison device of at least one of the bypass circuits contains an inversion device to generate the comparison bits from the reference bits by transmission of the reference bits with inversion of at least one of the M preselected reference bits, and a pattern according to which the inversion or noninversion of the M preselected reference bits is effected at the comparison device is not the same in all of the bypass circuits.

In accordance with another feature of the invention, a number of different patterns according to which the inversion or noninversion of the M preselected reference bits is affected at the comparison device and is as large as possible, and in that a frequency of the different patterns is as uniform as possible.

In accordance with a further feature of the invention, the sensitization circuit contains a first logic circuit having M inputs and an output supplying a switching bit having a first binary value if the M preselected reference bits differ from the chosen bit combination, and otherwise has a second binary value. The control circuit contains a second logic circuit supplying the selection signal if the switching bit has the first binary value and the hit information item is present.

In accordance with another added feature of the invention, the M inputs of the first logic circuit are fixedly connected to the reference bit transmitter to receive the M preselected reference bits. The second logic circuit has inputs fixedly connected to the outputs of the comparison device and to the first logic circuit to receive the hit information item and the switching bit.

In accordance with another further feature of the invention, M=K, the second logic circuit has a first input and a second input, and the comparison device has K outputs for supplying K output bits corresponding to a predefined bit combination precisely when the address bits correspond to a bit combination which is reversibly unambiguously assigned to a bit combination of the comparison bits. The sensitization circuit has a bi-stable circuit with an output. The bypass circuits each contain a changeover device. The changeover device in a first switching state, connects the inputs of the first logic circuit to the outputs of the comparison device and connects the output of the first logic circuit to the first input of the second logic circuit. The changeover device in a second state, connects the inputs of the first logic circuit to the reference bit transmitter and connects the output of the first logic circuit to the bi-stable circuit. The output of the bi-stable circuit goes to the second binary value if the first logic circuit supplies the first binary value, and goes to the first binary value if the first logic circuit supplies the second binary value. The second logic circuit supplies the selection signal precisely when the first and second inputs of the second logic circuit both receive the first binary value. The changeover device can be temporarily changed over from the first switching state to the second switching state by an initialization pulse.

In accordance with a concomitant feature of the invention, the chosen bit combination of the M preselected reference bits is that which the reference bit transmitter supplies in an original state before a programming of the programmable links.

Other features which are considered as characteristic for the invention are set forth in the appended claims.

Although the invention is illustrated and described herein as embodied in an addressing device for selecting regular and redundant elements, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
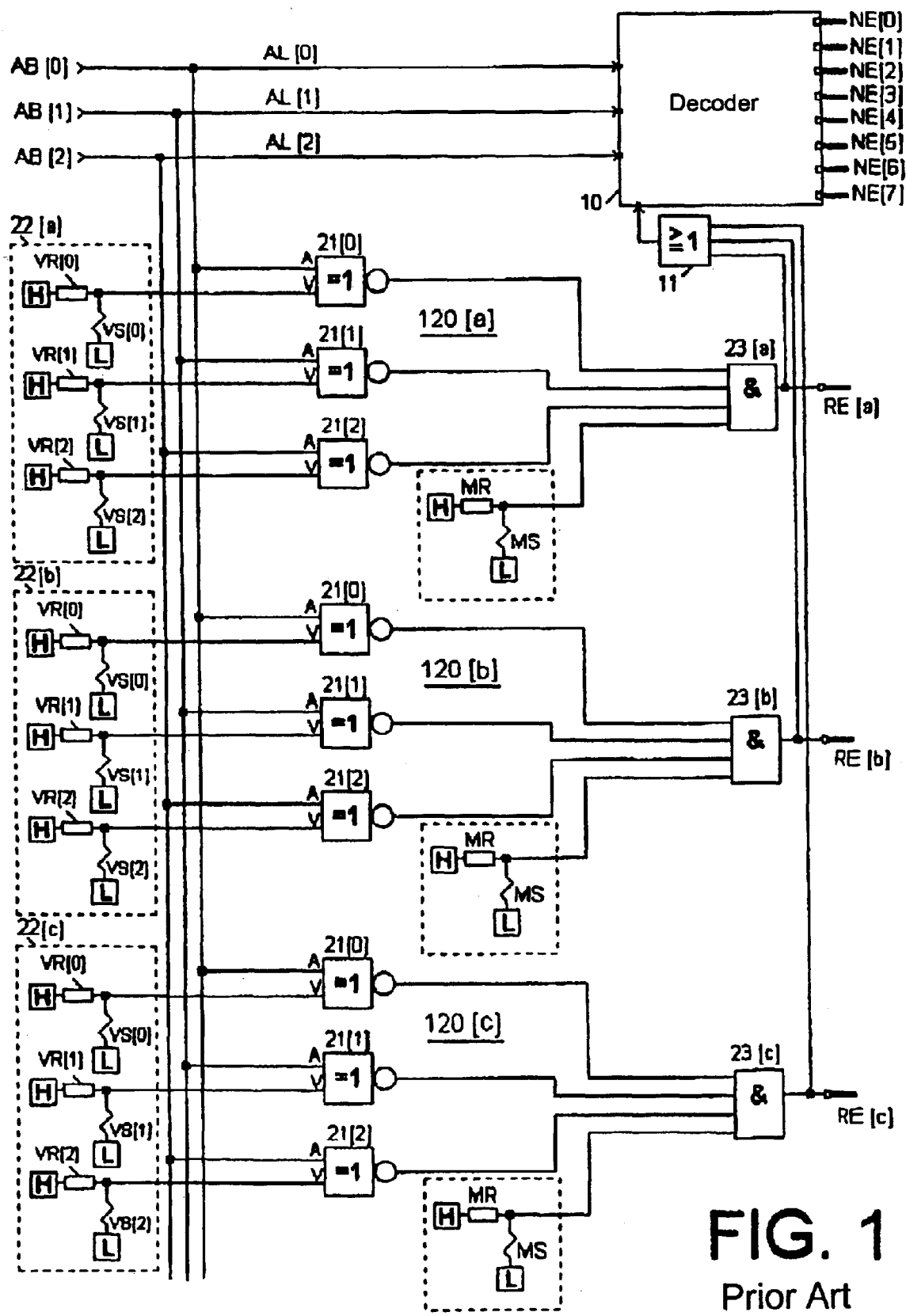
FIG. 1 is a block circuit diagram of a programmable device for addressing regular and alternatively redundant elements according to the prior art.

Referring now to the figures of the drawing in detail and first, particularly, to FIG. 1 thereof, there are shown addressing devices which, for the purpose of illustration, are dimensioned for the addressing of N=8 elements. The number R of redundant elements is equal to 3 in the case illustrated. A number K of address bits is equal to 1d(N)=3. In practice, N may be any arbitrary integer power of 2 and is often much greater than 8. If the elements to be addressed are e.g. rows or columns of a memory matrix, numbers N equal to 512 or 1024 or even higher are customary; in these cases, the number R of redundant elements is only a few percent of N, usually in the region of 2 to 4 percent.

In the various drawings, parts which are identical or of the same kind are designated in each case by the same reference numerals or abbreviations in upper case which, for more specification identification, are in each case followed by a number or a lower case letter as sequential number in brackets. A colon between two numbers or lower case letters within brackets is to be read as "to". Thus, by way of example, "address bits AB[0:2]" is to be read as "address bits AB[0] to AB[2]", and "bypass circuits 120[a:c]" is to be read as "bypass circuits 120[a] to 120[c]".

The known addressing device illustrated in FIG. 1 is configured, as stated, for selectively addressing an arbitrary element of N=8 regular elements NE[0:7] and alternatively a selectable element of K=3 redundant elements RE[a:c]. The elements NE and RE are represented by thick short lines on the right in FIG. 1. In the case described here, "addressing" of an element refers to a potential corresponding to the binary or logic value "1" is applied to the element.

The eight regular elements NE[0:7] are connected to the eight outputs of a 1-out-of-8 decoder 10, which has K=3 inputs for receiving the bits AB[0:2] of a 3-bit input address, which are fed via three parallel address lines AL[0:2]. In the switched-on state of the decoder 10, with each of the eight possible input addresses, a respectively assigned specimen of the outputs is put at a "high" potential (H level) which corresponds to the logic or binary value "1", whereby the specimen of the regular elements NE[0:7] that is connected there is addressed. The other seven outputs in each case remain at "low" potential (L level), which corresponds to binary value "0".

Each of the three redundant elements RE[a:c] is connected to the output of a respectively assigned specimen of three bypass circuits 120[a:c], which are configured to be identical to one another. Each bypass circuit 120 contains an AND gate 23 with K+1=4 inputs and an output. The outputs of all the AND gates 23[a:c] are connected to inputs of an OR gate 11, whose output leads to a deactivation terminal DE of the decoder 10 in order to switch off the decoder 10 if at least one of the AND gates 23[a:c] supplies a "1".

Each bypass circuit 120 additionally contains K=3 XNOR gates (EXCLUSIVE-NOR gates) 21[0:2] each having two inputs A and V. Three inputs of the AND gate 23 are connected to the outputs of the three XNOR gates 21[0:2]. The A inputs of the XNOR gates 21[0:2] in all the bypass circuits 120[a:c] receive the bits AB[0:2] of the input address. The V inputs of the three XNOR gates 21 are connected for receiving the three bits of a programmable comparison address. For this purpose, the V input of each XNOR gate 21 is connected to a source of the L potential (usually ground potential) via a respective individually assigned fusible link VS and is additionally connected to a source of the H potential via a high-value resistor VR. Alternatively, it is noted that the programmable fusible links VS could be replaced by anti-fuses to perform the same programming function.

As long as a fusible link VS is undestroyed, the L potential, that is to say a logic "0", appears at the V input of the assigned XNOR gate 21. If a fusible link VS is destroyed, the H potential, that is to say a logic "1", appears at the V input of the assigned XNOR gate 21. Thus, at each of the three bypass circuits 120[a:c], the three fusible links VS[0:2] together with the resistors VR[0:2] form a reference bit transmitter 22 for directly supplying the three comparison bits whose binary values are programmable by selective destruction or preservation of the fusible links VS. If all the bits AB[0:2] of an input address correspond to the programmed comparison bits in one of the bypass circuits 120[a:c], then all the XNOR gates 21[0:2] of the bypass circuit supply a "1" on the output side.

As an example, suppose that only two of the eight regular elements NE[0:7] are defective, to be precise the element NE[1], which corresponds to the input address "001", and the element NE[5], which corresponds to the input address "101", and that these defective elements are intended to be replaced by the redundant elements RE [a] and RE [b]. In this case, the reference bit transmitter 22 [a] is programmed for supplying the bit combination "001" by only the fusible link VS[0] being destroyed there, while the fusible links VS[1] and VS[2] are preserved. The reference bit transmitter 22[b] is programmed for supplying the bit combination "101" by the fusible links VS[0] and VS[2] being destroyed there, while the fusible link VS[1] is preserved. The consequence is that all three XNOR gates 21[0:2] of the first bypass circuit 120[a] supply a "1" precisely when the input address "001" of the defective regular element NE[1] appears. And all three XNOR gates 21[0:2] of the second bypass circuit 120[b] supply a "1" precisely when the input address "101" of the defective regular element NE[5] appears.

The occurrence of a "1" at the outputs of all three XNOR gates 21[0:2] of the bypass circuit 120[a] or 120[b], that is to say a correspondence between the input address that appears and the respectively programmed comparison address, can thus be utilized in order to switch off the decoder 10 and alternatively to address the assigned redundant element RE[a] or RE[b] by application of a "1". However, there is a problem owing to the presence of the unutilized redundant element RE[c] and the third bypass circuit 120[c] connected thereto. The reference bit transmitter 22[c] of the bypass circuit also inevitably supplies any comparison address which corresponds to a possible input address, e.g. in the case illustrated (all the fusible links VS[0:2] undestroyed) this is the bit combination "000", which corresponds to the address of the regular element NE[0], which is defect-free in the present exemplary case.

It is thus necessary to take particular precautions in order to prevent a bypass circuit that leads to an unutilized redundant element from responding. The precautions typically consist in providing a sensitization circuit at each bypass circuit in order to be able to put the bypass circuit into a active state only as required, that is to say only if the assigned redundant element RE is actually intended to be utilized.

In the case of the prior art, as illustrated in FIG. 1, the above-mentioned sensitization circuits are formed by an additional "master" fusible link MS at each bypass circuit 120. In the example shown, the master fusible link MS is located between the forced input of the AND gate 23 and the L potential. A high-value resistor MR leading to the H potential ensures that the fourth input of the AND gate 23 is pulled to "1" if the master fusible link MS is destroyed. The input is pulled to "0" when the master fusible link MS is undestroyed.

In the present exemplary case in which only the redundant elements RE[a] and RE[b] are intended to be utilized, the master fusible links MS [a] and MS[b] of the assigned bypass circuits 120[a] and 120[b] must be destroyed, so that the AND gates 23 [a] and 23[b] each receive a "1" as a switching bit at their fourth input. Consequently, only these gates can respond and supply a "1" at the output if the assigned XNOR gates 21 signal a correspondence between the address bits AB[0:2] and the bits supplied by the assigned reference bit transmitter 22. As a result of this, the relevant redundant element RE[a] or RE[b] is addressed, while the decoder 10 is switched off via the OR gate 11. Since the redundant element RE[c] is not intended to be utilized, the master fusible link MS of the assigned bypass circuit 120[c] is not permitted to be destroyed, so that the AND gate 23[c] always receives a "0" at its fourth input and can never supply a "1" at its output, no matter which input address appears and no matter how the assigned reference bit transmitter 22[c] is programmed.

Consequently, the master fusible links MS form the required sensitization circuits for supplying a "sensitization" switching bit in order to optionally put the respectively assigned bypass circuit 120 into the functional state.

According to the present invention, the sensitization circuits are realized by a method other than master fusible links, so that the number of fusible links is smaller overall. Three different embodiments of the invention are described below with reference to FIGS. 2, 3 and 4.

Figure 2:
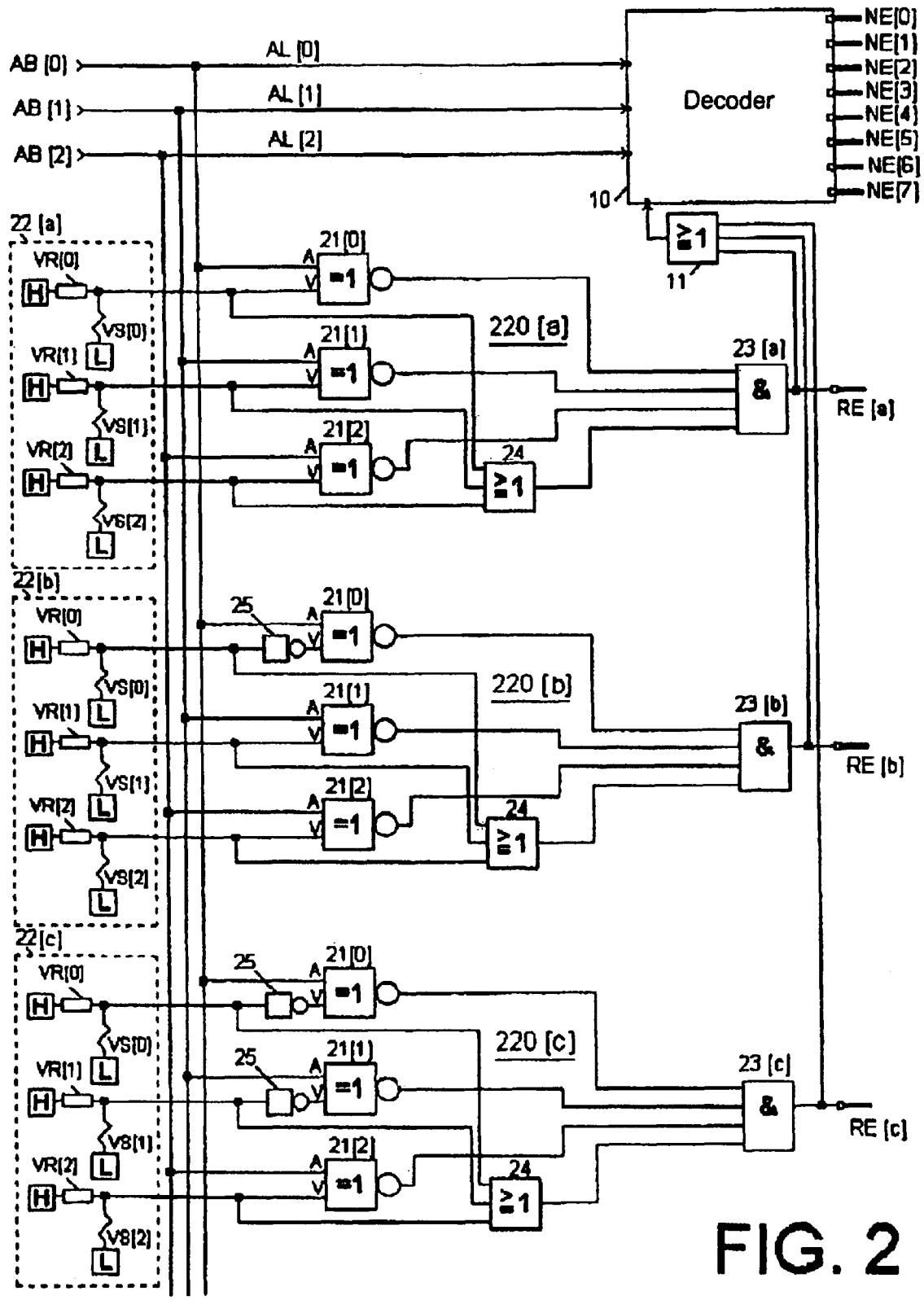
FIGS. 2 to 4 are block circuit diagrams of addressing devices according to the invention in three different embodiments.

The first embodiment of an addressing device according to the invention as shown in FIG. 2 differs from the known embodiment according to FIG. 1 only in that the master fusible links MS and the associated resistors MR are absent and an OR gate 24 is provided instead in each of the bypass circuits, which are designated by the reference numeral 220 in FIG. 2, which OR gate receives the reference bits from the assigned reference bit transmitter 22 and drives the forced input of the output-side AND gate 23, and that an inverter 25 is connected upstream of the comparison inputs V of some of the XNOR gates 21. All the other constituent parts of the addressing device are unchanged from FIG. 1 and designated by the same reference symbols as therein, so that a repeated description is superfluous.

Each OR gate 24 fulfils the task of generating the switching bit for the forced input of the assigned AND gate 23 and thus for the sensitization of the relevant bypass circuit 220. The OR gates 24 supply a "1" at the fourth input of the respectively assigned AND gate 23 only when the three reference bits supplied by the assigned reference bit transmitter 22 are different from the address "000". The programming of a reference bit transmitter 22 to a bit combination that is different from "000" thus automatically has the effect that the relevant bypass circuit 220 is sensitized into the active state and can thus bypass the addressing of a regular element NE to be connected to redundant element RE. If a redundant element RE is not intended to be utilized, the relevant bypass circuit 220 is kept deactivated by the assigned reference bit transmitter 22 being programmed to "000". In the case shown, this is done by none of the fusible links VS in the relevant reference bit transmitter 22 being destroyed. The bit combination "000" thus represents a "switch-off bit combination" which is specially reserved for a programming of the reference bit transmitters 22 for permanently switching off the relevant bypass circuit 220.

The switch-off bit combination "000" corresponds to the address of the element NE[0], however. If no particular additional measures are taken, this element thus cannot be replaced by a redundant element RE. It would thus be necessary, to be on the safe side, for the element NE[0] to be excluded from use or actually omitted from the outset, thereby fundamentally reducing the number N to $2^K-1$. There are applications in which this limitation can be tolerated.

It should preferably be possible, however, as required, to replace any arbitrary element of $N=2^K$ regular elements NE by a defect-free redundant element RE, that is to say including a regular element whose address corresponds to the switch-off bit combination. For this purpose, at least one of the bypass circuits 220[a:c] should be configured in such a way that all of its XNOR gates 21[0:2] supply a "1" at the output upon receiving address bits AB[0:2] which correspond to the switch-off bit combination, even though a bit combination which differs from the switch-off bit combination is programmed in the assigned reference bit transmitter 22 (because this difference is, after all, a necessary condition for the sensitization of the relevant bypass circuit).

In the case illustrated in accordance with FIG. 2, the bypass circuit 220[b] is configured such that, as required, it can also replace the regular element NE[0], whose address corresponds to the switch-off bit combination "000", by the redundant element RE[b]. For this purpose, the bypass circuit 220[b] contains a single inverter 25[0], which is connected upstream of the V input of the XNOR gate 21[0]. If the regular element NE[0] is defective and is intended to be replaced by the redundant element RE [b], only the fusible link VS[0] is destroyed in the reference bit transmitter 22 [b], so that the reference bit transmitter supplies the bit combination "001" which, on the one hand, causes the OR gate 24 to output a "1" and thus sensitizes the bypass circuit 220[b], but, on the other hand, owing to the inverter 25[0] present, generates the bit combination "000" at the V inputs of the XNOR gates 21[0:2]. Thus, if the input address "000" corresponding to the defective regular element NE[0] appears at the A inputs of the XNOR gates 21[0:2], all these gates also supply a "1", so that the output-side AND gate 23[b] addresses the connected redundant element RE[b] by outputting a "1", as desired.

The bypass circuit 220[b] in accordance with FIG. 2 can be programmed arbitrarily, then, by selective destruction of fusible links VS[0:2] in the assigned reference bit transmitter 22 [b], in order to replace an arbitrary regular element NE (including NE[0]) by the redundant element RE[b]. However, the regular element NE[1], which corresponds to the address "001", is excluded because, owing to the inverter 25[0], a comparison bit combination corresponding to this address could appear at the V inputs of the XNOR gates 21[0:2] only if the reference bit transmitter 22 [a] were programmed to the switch-off bit combination "000".

It generally holds true that each bypass circuit 220 can be configured, by inserting or omitting inverters at the V inputs of selected XNOR gates 21, in such a way that it can be programmed to the replacement of an arbitrary element of N-1 regular elements NE. The respective sole excluded regular element NE is the one whose address precisely corresponds to the pattern of the presence or absence of an inverter 25 at the V inputs of the three XNOR gates 21 (where the presence of an inverter is to be considered as "1" and the absence as "0").

In the case of the bypass circuit 220[b], NE[1] is the excluded element, as stated, because the "inverter pattern" there is "001" (only at the XNOR gate 21[0] of the least significant bit position LSB is an inverter 25 present), which corresponds to the address of NE[1]. In the case of the bypass circuit 220[a], which contains no inverter 25 at all (inverter pattern "000"), the element NE[0], whose address corresponds to the switch-off bit combination, is excluded. In the case of the bypass circuit 220[c], which contains a respective inverter 25 upstream of the XNOR gates 21[0] and 21[1] (inverter pattern 011), the element NE[3] is excluded.

In order to ensure that in reality none of the regular elements NE is excluded from the possibility of being replaced, the inverter pattern upstream of the XNOR gates 21 must not be identical in all the bypass circuits 220. In other words, the inverter pattern must be different in at least one bypass circuit than in at least one other bypass circuit. Preferably, the inverter patterns are all different. On average this optimizes the replacement possibilities for all the regular elements. This is because, for an arbitrary defective regular element NE [i], there then exists in each case only a single redundant element RE[j], which is not considered as a replacement despite possible freedom from defects. The redundant element RE[j] retains sufficient usefulness, however, because it can be used as a replacement for any of the other regular elements. In a similar manner, all other redundant elements, provided that they are defect-free, are taken into consideration as a possible replacement for said defective regular element NE [i].

During the programming of the reference bit transmitters 22, it is necessary, of course, to take account of the pattern of the inverters 25. A fusible link VS that would have to be destroyed in the absence of an inverter must be preserved if an inverter 25 is located upstream of the V input of the assigned XNOR gate. A fusible link VS which would have to be preserved in the absence of an inverter must be destroyed if an inverter 25 is located upstream of the V input of the assigned XNOR gate. If, by way of example, in the device according to FIG. 2, the regular element NE[6]

corresponding to the input address "110" is intended to be replaced by the redundant element RE[c], then the XNOR gates 21[0:2] of the bypass circuit 220[c] must receive the bit combination "110" at their V inputs. Owing to the inverters 25 upstream of the V inputs of the XNOR gates 21[0] and 21[1] in the bypass circuit 220[c], the fusible link VS[0] must be destroyed for this purpose in order to supply a "1", which is then inverted into the desired "0". VS [1] must be preserved in order to supply a "0", which is then inverted into the desired "1". VS[2] must be destroyed in order to directly supply the desired "1".

Any other bit combination that differs from "000" can also be chosen as the switch-off bit combination, in which case, however, for each bit of the switch-off bit combination that differs from "0", it is necessary to provide an inverter upstream of the assigned input of the OR gate 24. The case of a switch-off bit combination "000" as shown in FIG. 2 has the advantage, however, that this bit combination corresponds to the original state of all the reference bit transmitters 22[a:c]. Thus, if the functional test has shown that all the regular elements NE[0:7] are defect-free and, consequently, none of the redundant elements RE[a:c] is required as a replacement, all the reference bit transmitters are to be left in their original state; a subsequent intervention is thus no longer required in this case.

In the exemplary embodiment shown in FIG. 2, the binary values of all K reference bits of the assigned reference bit transmitter 22 are checked in each bypass circuit 220 for generating the switching bit which sensitizes the relevant bypass circuit. This affords the greatest possible flexibility since, in this case, each redundant element RE can be used as a replacement for an arbitrary specimen of in each case N-1 regular elements NE, as described above. If such great flexibility is not necessary, it is possible to reduce the circuitry outlay for the sensitization of the bypass circuits by using only a subset of the K reference bits for deriving the sensitization switching bit.

Thus, it is possible to simplify the addressing device according to FIG. 2 in that, in each bypass circuit 220, only two of the three reference bits are applied to the OR gate 24 for analysis, e.g. the two least significant reference bits which are assigned to the two least significant address bits AB [0] and AB [1] and are programmed by the fusible links VS [0] and VS [1] of the reference bit transmitters 22. In this case, the switch-off bit combination is "X00" ("X" stands for any desired binary value). Consequently, the redundant element RE[a], whose bypass circuit 220[a] does not contain an inverter upstream of the XNOR gates 21[0] and 21[1], cannot be used as a replacement for the two regular elements NE[0] and NE[4], whose least significant address bits are "00", but can be used as a replacement for each of the remaining six regular elements NE[1:3] and NE[5:7]. The redundant element RE[b], whose bypass circuit 220[b] contains an inverter 25 only upstream of the XOR gate 21[0], cannot be used as a replacement for the two regular elements NE[1] and NE[5], but can be used as a replacement for each of the remaining six regular elements NE[0], NE[2:4] and NE[6:7]. The redundant element RE[c], whose bypass circuit 220[c] contains inverters 25 upstream of both XNOR gates 21[0] and 21[1], cannot be used as a replacement for the two regular elements NE[3] and NE[7], but can be used as a replacement for each of the remaining six regular elements NE[0:2] and NE[4:7].

It is even possible to implement a limitation to the effect of using only a single bit of the K reference bits for deriving the sensitization switching bit, e.g. only the least significant reference bit which is assigned to the least significant address bit AB[0] and is programmed by the fusible link VS[0] in each reference bit transmitter. In this case, the switch-off bit combination is "XX0", the analysis is limited to a single bit, the OR gate 24 can be omitted and a simple connection from the relevant fusible link to the forced input of the AND gate 23 suffices instead. The redundant element RE[a], whose bypass circuit 220[a] does not contain an inverter upstream of the XOR gate 21[0], then cannot be used as a replacement for the four regular elements NE[0, 2,4,6], but can be used as a replacement for each of the remaining four regular elements NE[1,3,5,7]. The redundant element RE[b] and also the redundant element RE[c], whose bypass circuits 220[b] and 220[c], respectively, contain an inverter upstream of the XOR gate 21[0], cannot be used as a replacement for the four regular elements NE[1,3,5,7], but can be used as a replacement for each of the remaining four regular elements NE[0,2,4,6].

The following generally holds true. For generating the switching bit, it is possible to select any arbitrary number M from the set of K reference bits, that is to say $1 \leq M \leq K$. The larger M is, the greater the flexibility in the utilization of the redundant elements, because for each redundant element RE there is a subset of $2^K - 2^{K-M}$ regular elements NE which can be replaced by the relevant redundant element. In order to distribute these subsets as uniformly as possible between the redundant elements present and thus to optimize the flexibility, preferably as many different patterns of inverters 25 as possible should be used in the various bypass circuits 220. Appropriate locations for the inverters 25 are, of course, only the V inputs of those M XNOR gates 21 which are assigned to the M selected reference bits. $2^M$ different inverter patterns are thus possible. If the number R of redundant elements RE is greater than $2^M$, it is essential to use some inverter patterns more than once. Preferably, however, the frequency of each inverter pattern should differ as little as possible from the frequency of other patterns. This means, e.g. for the case M=1, in which only two inverter patterns are possible (presence or absence of an inverter upstream of the input of the XNOR gate assigned to the sole selected reference bit), that the two patterns are divided as far as possible half and half between the various bypass circuits 220.

In the case M<K, it is not mandatory for the M reference bits which are selected for the generation of the sensitization switching bit to be assigned to the same address bits in all the bypass circuits, as described. The identical assignment has the advantage that the switch-off bit combination is the same for all the bypass circuits. A different assignment means, however, that it is possible to manage with fewer inverters 25 in order to increase the flexibility in the possibilities for utilization of the redundant elements.

A choice of M<K may be advantageous in particular when the addressing device is intended to serve e.g. for the selective driving of the rows or columns of a relatively large memory matrix. In such cases, a lower degree of flexibility may even be welcome because, for design reasons, in the case of large memory matrices it is necessary anyway to reserve each redundant row or column only for a relatively narrowly delimited subset of regular rows or columns.

Figure 3:
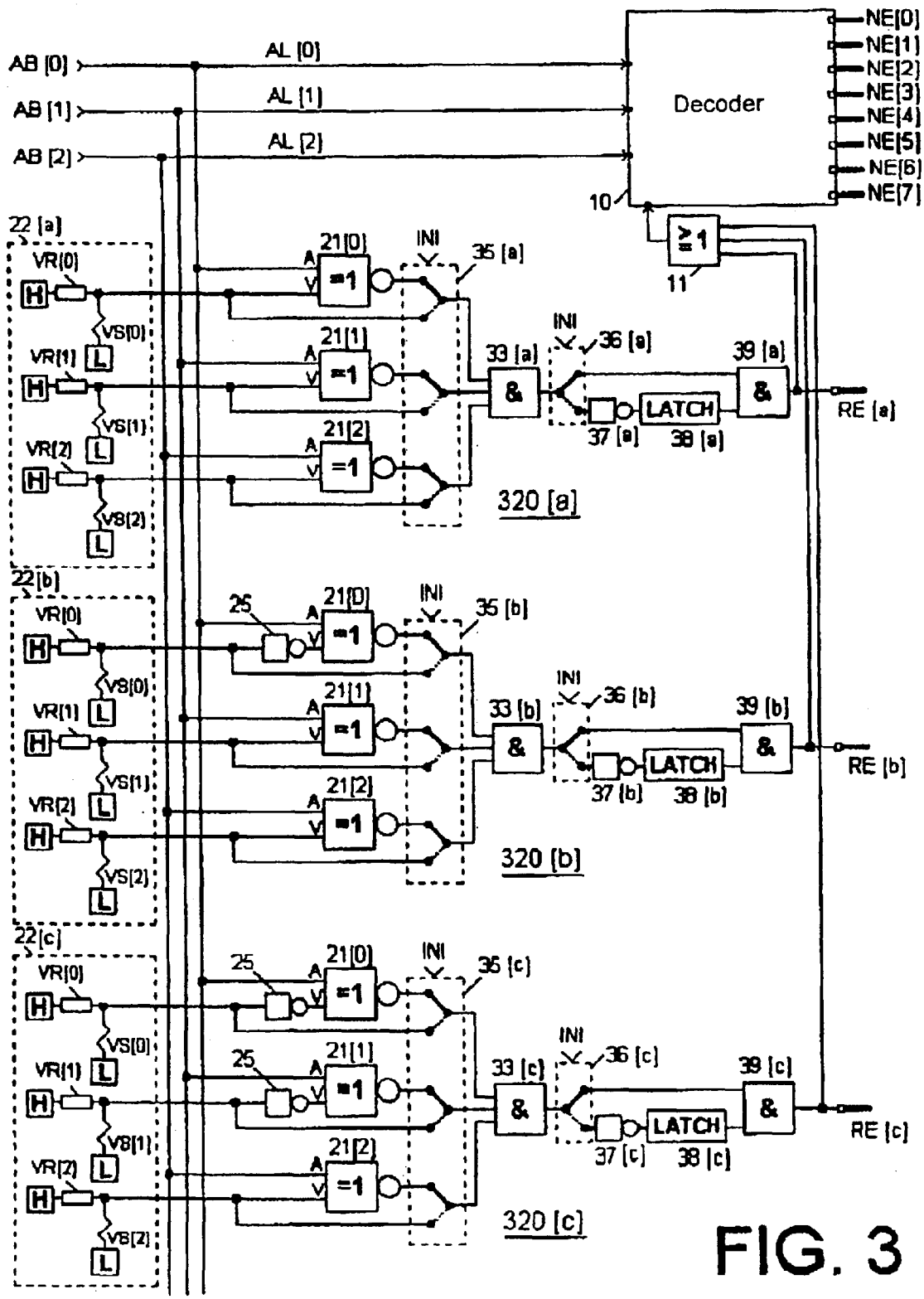

Moreover, a choice of M<K always has the advantage that the OR gate 24 can be smaller and requires fewer leads than in the case of M=K. This is because if the number N of regular elements NE is very large and the number K of address bits and reference bits is thus also very large, the space requirement for the OR gate 24 used for generating the sensitization switching bit can become relatively large in the addressing device according to FIG. 2 if all K reference bits are used to generate the switching bit. In the case of a choice of M=1, the OR gate can even be completely dispensed with, as mentioned further above, although with a great loss of flexibility in the utilization of the redundant elements. FIG. 3 shows a way of being able to manage without OR gates 24 and nevertheless obtaining maximum flexibility.

The embodiment of an addressing device according to the invention that is shown in FIG. 3, just like the embodiment according to FIG. 2, utilizes all K reference bits for deriving the sensitization switching bit. It contains bypass circuits 320[a:c], which differ from the bypass circuits 220[a:c] according to FIG. 2 inter alia by virtue of the fact that the OR gates 24[a:c] are absent. The same AND gate which also logically combines the outputs of the three XNOR gates 21[0:2] is utilized for generating the switching bit. In the case of FIG. 3, an AND gate 33 has only three inputs, which can optionally be connected, by a three-pole changeover switch 35, to the outputs of the three XNOR gates 21[0:2] or to the assigned reference bit transmitter 22 for receiving the three reference bits. The output of the AND gate 33 can optionally be connected via a single-pole changeover switch 36 to a first input of a further AND gate 39 or, via an inverter 37, to the input of a latch 38. The inverter 37 and the latch 38 form a bistable circuit that stores the inverted version of its input bit. The output of the latch 38 is connected to the second input of the AND gate 39, which has only the two aforesaid inputs. The output of the AND gate 39 forms the output of the relevant bypass circuit 320, which, as in the case of FIG. 2, is connected to the assigned redundant element RE and to the OR gate 11 in order, by supplying a "1", to switch off the decoder 10 and to address the relevant redundant element RE.

The remaining parts of the addressing device according to FIG. 3 correspond to the addressing device according to FIG. 2 and are designated by the same reference numerals as therein. They also operate in the same way, so that a more detailed description of their construction and their function is unnecessary.

The three-pole changeover switch 35 and the single-pole changeover switch 36 can be controlled jointly by an initialization pulse INI in order to transfer them from a normal state, which is symbolized by the switch position drawn bold in FIG. 3, into an initialization state, which is symbolized by the switch position drawn using broken lines, for a short duration. The initialization pulse INI is supplied from a suitable non-illustrated source at the beginning of the operation of the addressing device, e.g. when the power supply is switched on. If the elements NE and RE to be addressed are the rows or columns of the matrix of a memory bank, the initialization pulse can be derived from the bank select signal.

For the duration of the initialization pulse INI (switch positions depicted by broken lines in FIG. 3), in all of the bypass circuits 320[a:c], the reference bits from the respectively assigned reference bit transmitter 22 are applied to the inputs of the assigned AND gate 33, and the output bit of the AND gate 33 is fed to the inverter 37 in order to store the inverted version of the bit in the latch 38. The stored bit thus acquires the value "1" whenever the assigned reference bit transmitter 22 supplies a bit combination which differs from "111". The stored bit can thus be used as a switching bit at the second input of the second downstream-connected AND gate 39 for the sensitization of the relevant bypass circuit 330. A precondition, however, is that "111" is used as the switch-off bit combination, i.e. as that bit combination to which a reference bit transmitter 22 is to be programmed if the assigned redundant element RE is not intended to be utilized.

After the end of the initialization pulse INI (switch positions drawn bold in FIG. 3), in all of the bypass circuits 320[a:c], the outputs of the XNOR gates 21[0:2] are applied to the inputs of the assigned AND gate 33, and the output bit of the AND gate 33 is applied to the first input of the AND gate 39. The input goes to "1" precisely when the address bits AB[0:1] at the A inputs correspond to the comparison bits at the V inputs of the assigned XNOR gates 21[0:2]. In the case of such correspondence, the AND gate 39 supplies the selection signal "1" for switching off the decoder 10 and addressing the assigned redundant element RE only when the switching bit stored in the latch 38 has the value "1", that is to say the assigned reference bit transmitter 22 is not programmed to the switch-off bit combination.

The addressing device according to FIG. 3 thus ultimately functions in exactly the same way as the addressing device according to FIG. 2, except that the reference bit combination "111" instead of "000" is to be programmed in the reference bit transmitter 22 of a redundant element that is not to be utilized. In other words, the redundant element RE[a], whose bypass circuit 320[a] does not contain an inverter upstream of the V inputs of the XNOR gates 21 (inverter pattern "000"), cannot be used as a replacement for the regular NE[7] corresponding to the input address "11", but can be used as a replacement for any arbitrary other regular element. The possibilities for using the other redundant elements RE[b] and RE[c] are exactly the same as those described in connection with FIG. 2.

In a similar manner to the embodiment according to FIG. 2, the addressing device according to FIG. 3 can also be modified in order to prescribe any other bit combination chosen as switch-off bit combination. If the switch-off bit combination is intended to be different than "111", then each "0" bit of the combination must be inverted before the ANDing is effected in the AND gate 33. The inversion can be effected by a respective inverter upstream of the relevant reference bit terminal of the changeover switch 35 or directly at the relevant input of the AND gate 33. In the second-mentioned case, however, it is also necessary to invert the output bit of that XNOR gate 21 which is fed to the relevant input of the AND gate 33 via the changeover switch 35. This can be realized in a simple manner by using an XOR gate (exclusive-OR gate) instead of the relevant XNOR gate. Thus, if it is desired to choose e.g. the bit combination "000" at the reference bit transmitter 22 as a switch-off bit combination, the bypass circuit 320 could be constructed in such a way that all the XNOR gates 21 are replaced by XOR gates and all the inputs of each AND gate 33 are inverting inputs. Such an embodiment has the advantage that (in a manner similar to that in the case of FIG. 2) all the reference bit transmitters 22 can be left in their original state and, consequently, no intervention whatsoever has to be effected if all the regular elements NE[0:7] are defect-free.

Figure 4:
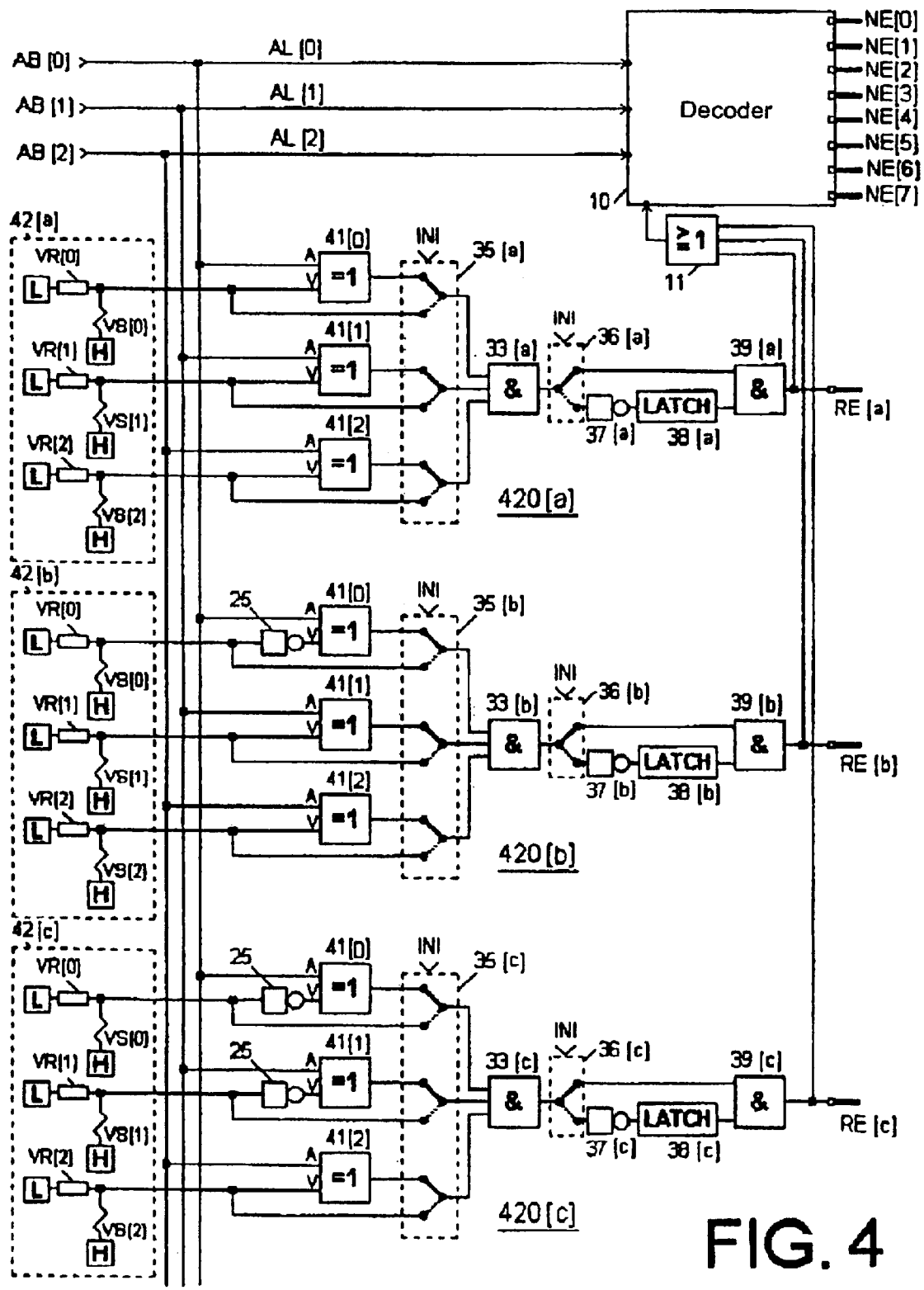

The same advantage can also be obtained, however, by modifying the addressing device according to FIG. 3 in the manner shown in FIG. 4. The modification consists in using XOR gates 41[0:2] instead of the XNOR gates 21[0:2] shown in FIG. 3, and in interchanging the potential terminals for H and L in the reference bit transmitters. In other words, each fusible link VS[0:2] in each reference bit transmitter 42[a:c] according to FIG. 4 is connected to H potential by one of its ends and is connected via the associated high-value resistor VR to L potential by its other end. Thus, at each fusible link VS, a "1" is supplied as reference bit if the bridge is in the undestroyed original state; a "0" is supplied after destruction. All the remaining parts of the addressing device according to FIG. 4 correspond to the embodiment according to FIG. 3 with no change and are designated by the same reference numerals as therein.

If a reference bit transmitter 42 is left in the original state, that is to say none of its fusible links VS[0:2] is destroyed, the reference bit combination "111" is supplied, so that when the initialization pulse INI is applied (changeover switches 35 and 36 in the position drawn using broken lines), all the inputs of the AND gate 33 are at "1" and the sensitization switching bit in the latch 38 is latched to the binary value "0". The relevant bypass circuit 420 is thereby deactivated. The reference bit combination "111" is thus the switch-off bit combination, as in the case of FIG. 3. Any other reference bit combination which can be set by the destruction of selected specimens of the fusible links VS in a reference bit transmitter 42 leads to the sensitization of the relevant bypass circuit 420.

The XOR gates 41 supply a "1" at their output precisely when the bits at their two inputs A and V are different. In other words, a hit information item "111" at the outputs of the three XOR gates 41[0:2] appears precisely when the address bits AB[0:2] received at the A inputs are the inverted mapping of the comparison bits received at the V inputs. Thus, by way of example, if the regular element NE[5] having the address "101" is intended to be replaced by the redundant element RE[a] then the reference bit transmitter 42[a] of the bypass circuit 420[a] is to be programmed in such a way that the comparison bits at the V inputs of the assigned XOR gates 41[0:2] produce the bit combination "010" (inverted mapping of the address "101"). Consequently, the fusible links VS[0] and VS[2] of the reference bit transmitter 42[A] must be destroyed in this exemplary case.

In the addressing circuit according to FIG. 4, the redundant element RE[a] can be used as a replacement for all the regular elements with the exception of the element NE[0], because this element has the address "000", the inverted mapping "111" of which is identical to the switch-off bit combination. In a manner similar to that in the case of FIG. 2, however, each of the other redundant elements RE[b] and RE[c] can be used as a replacement for NE[0], by virtue of the inverters 25 upstream of the V inputs of selected XOR gates 41 in the associated bypass circuits. Thus, in the case of the embodiment according to FIG. 4, the possibilities for using redundant elements RE[a], RE[b] and RE[c] are exactly the same as those described in connection with FIG. 2.

Expressed in a generalized form, the following common specification applies to the embodiments according to FIGS. 3 and 4:

a). The gate 33 must be constructed in such a way that it supplies a bit of a predetermined binary value at its output only when it receives a predefined bit combination at its inputs.

b). The comparison device formed by XNOR gates or XOR gates must be constructed in such a way that it generates the predefined bit combination only when the address bits at the A inputs correspond to a bit combination which is unambiguously related to the bit combination of the comparison bits at the V inputs.

c). The device for transmitting the reference bits to the changeover switch 35 must be configured in such a way that they supply the predefined bit combination precisely when the reference bits correspond to the switch-off bit combination that is to be prescribed.

In the case of the embodiment according to FIG. 3 (and also in the case of the embodiment according to FIG. 2), the abovementioned unambiguous relationship is the "identical" mapping, corresponding to a modulo-2 addition with "000" (identity of the address bits with the comparison bits); in the case of the embodiment according to FIG. 4, it is the "inverse" mapping, corresponding to a modulo-2 addition with "111" (identity of the address bits with the inverted comparison bits). In principle, any other unambiguous relationship is also possible. If e.g. each comparison device contains an XNOR gate 21[0] for the address bit AB[0], an XOR gate 41[1] for the address bit AB[1] and an XNOR gate 21[2] for the address bit AB[2], the relationship corresponds to a modulo-2 addition with "010". All that is important is that each comparison device can be set by the programming of the respectively assigned reference bit transmitter to the unambiguous identification of an arbitrarily selected address.

The three changeover elements in the three-pole changeover switch 35 and the changeover element in the changeover switch 37 are represented symbolically as pivotable switching arms in FIG. 3. Of course, each changeover element is in practice realized by electronic devices, e.g. by field-effect transistors, as illustrated in FIG. 5.

Figure 5:
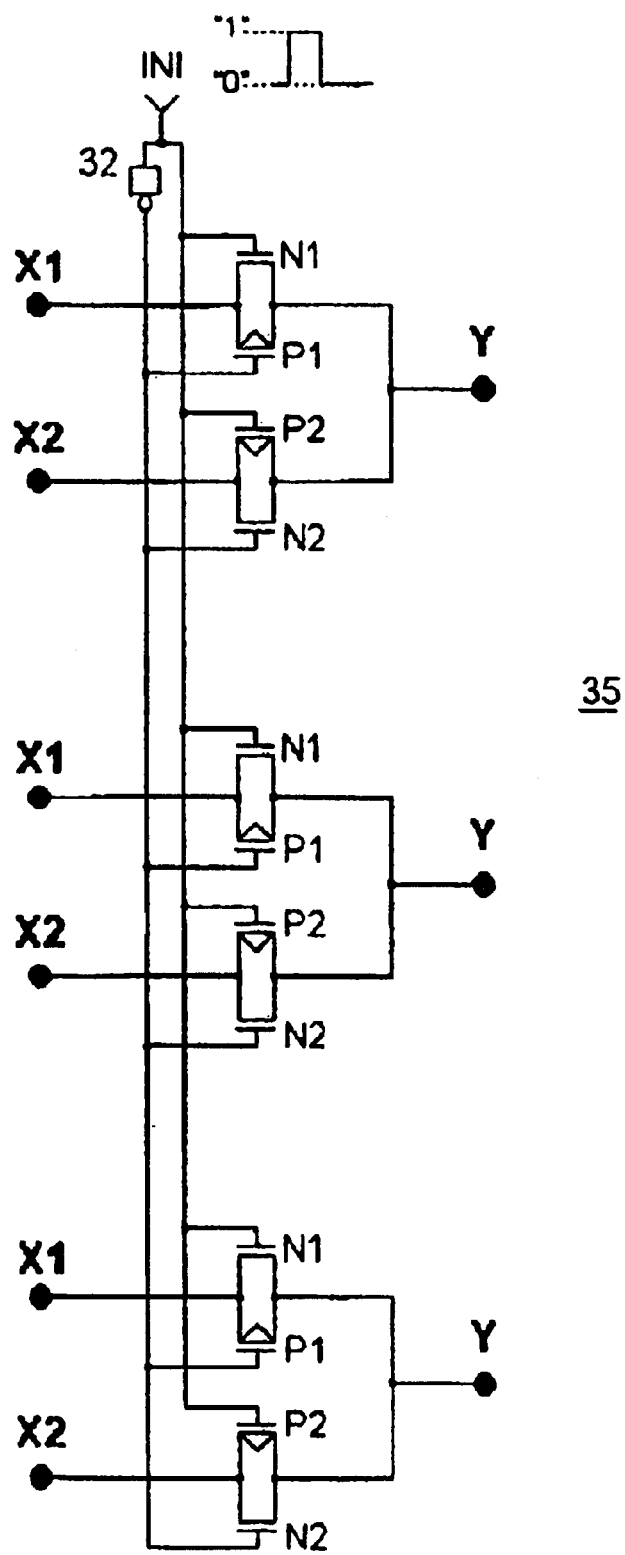
FIG. 5 is a circuit diagram of one possible embodiment of a changeover device used in the addressing devices according to FIGS. 3 and 4.

FIG. 5 shows one possible embodiment of the three-pole changeover switch 35 from FIGS. 3 and 4. The changeover switch 35 contains three sections each having two alternative contacts X1 and X2 and a collective contact wire. Located between the contact X1 and the collective contact Y is a first transmission gate, containing a MOS field-effect transistor N1 with an n-conducting channel (N-FET) and, connected in parallel therewith, a MOS field-effect transistor P1 with a p-conducting channel (P-FET). Located between the contact X2 and the collective contact Y is a second transmission gate, containing an N-FET N2 and a P-FET P2 connected in parallel therewith. The gates of N1 and P2 of all three sections are directly connected to a control input for receiving the initialization pulse INI, and the gates of P1 and N2 of all three sections are connected to the control input via an inverter 32.

If INI has the binary value "1" (that is to say H potential), N1 and P1 are in the on state, and N2 and P2 are in the off state, so that the collective contact Y is connected to the contact X1 and is decoupled from the contact X2. If INI has the binary value "0" (that is to say L potential), N2 and P2 are in the on state, and N1 and P1 are in the off state, so that the collective contact Y is connected to the contact X2 and is decoupled from the contact X1. When used in the addressing device according to FIG. 3, the three X1 contacts are connected for receiving the output bits of the XNOR gates 21[0:2], the three X2 contacts are connected for receiving the reference bits from the reference bit transmitter 22, and the three collective contacts Y are connected to the inputs of the AND gate 33.

The changeover switch 36 according to FIG. 3 is configured in exactly the same way as one of the three sections of the changeover switch 35 that are shown in FIG. 5, and is controlled in exactly the same way by the pulse INI. The collective contact Y of the changeover switch 36 is connected to the output of the AND gate 33, the X1 contact is connected to the first input of the AND gate 39, and the X2 contact is connected to the input of the inverter 37.

As stated, the addressing devices described above with reference to FIGS. 2 to 4 are only exemplary embodiments of the invention. Numerous modifications and alternative embodiments are possible within the scope of the concept of the invention. Thus, instead of the fusible links, it is also possible to provide different types of links which can be destroyed by methods other than melting, e.g. by mechanical action. Instead of destructible links, it is also possible to incorporate interruptions that can be closed by subsequent introduction of links. Instead of the high-value resistors VR at the link contacts in the reference bit transmitters 22, it is also possible to use latch circuits in order to force the potential to the desired level in the event of a destroyed (or non-inserted) link.

We claim:

1. An addressing device for selecting an element from one of a set of $N \leq 2^K$ regular elements and a set of R<N redundant elements depending on binary values of address bits of a K-bit input address, the addressing device comprising:

a 1-out-of-N decoder having K address inputs receiving the address bits and N outputs coupled to the N regular elements;

R bypass circuits each coupled to precisely one of the redundant elements, said R bypass circuits each coupled to said 1-out-of N decoder and each containing:

a sensitization circuit for setting a respective bypass circuit into an active state;

a reference bit transmitter having programmable links and supplying K reference bits individually assigned to the K address bits and values of the K reference bits being programmable by programming said programmable links, said programmable links selected from the group consisting of fuses and anti-fuses, said reference bit transmitter coupled to said sensitization circuit;

a comparison device connected to said reference bit transmitter and deriving K comparison bits from the reference bits, said comparison device comparing the comparison bits with the address bits and supplying a hit information item if the address bits correspond to a bit combination unambiguously related to the comparison bits; and a control circuit receiving the hit information item, upon receiving the hit information item said control circuit supplying a selection signal for switching off said 1-out-of-N decoder and addresses an associated redundant element if said respective bypass circuit is in the active state;

said sensitization circuit receiving $M \leq K$ preselected reference bits from said reference bit transmitter of said respective bypass circuit and sets said respective bypass circuit into the active state if binary values of the M preselected reference bits received differ from a chosen bit combination.

2. The addressing device according to claim 1, wherein the M preselected reference bits are assigned to the same M address bits at each said sensitization circuit.

3. The addressing device according to claim 1, wherein said comparison device of at least one of said bypass circuits contains an inversion device to generate the comparison bits from the reference bits by transmission of the reference bits with inversion of at least one of the M preselected reference bits, and a pattern according to which the inversion or noninversion of the M preselected reference bits is effected at said comparison device is not the same in all of said bypass circuits.

4. The addressing device according to claim 3, wherein a number of different patterns according to which the inversion or noninversion of the M preselected reference bits is effected at said comparison device and is as large as possible, and in that a frequency of the different patterns is as uniform as possible.

5. The addressing device according to claim 1, wherein:

said sensitization circuit contains a first logic circuit having M inputs and an output supplying a switching bit having a first binary value if the M preselected reference bits differ from the chosen bit combination, and otherwise has a second binary value; and said control circuit contains a second logic circuit supplying the selection signal if the switching bit has the first binary value and the hit information item is present.

6. The addressing device according to claim 5, wherein:

said M inputs of said first logic circuit are fixedly connected to said reference bit transmitter to receive the M preselected reference bits;

said comparison device has outputs; and said second logic circuit has inputs fixedly connected to said outputs of said comparison device and to said first logic circuit to receive the hit information item and the switching bit.

7. The addressing device according to claim 5, wherein:

M=K;

said second logic circuit has a first input and a second input;

said comparison device has K outputs for supplying K output bits corresponding to a predefined bit combination precisely when the address bits correspond to a bit combination which is reversibly unambiguously assigned to a bit combination of the comparison bits;

said sensitization circuit has a bi-stable circuit with an output;

said bypass circuits each contain a changeover device, said changeover device in a first switching state, connects said inputs of said first logic circuit to said outputs of said comparison device and connects said output of said first logic circuit to said first input of said second logic circuit, and said changeover device in a second state, connects said inputs of said first logic circuit to said reference bit transmitter and connects said output of said first logic circuit to said bi-stable circuit;

said output of said bi-stable circuit goes to the second binary value if said first logic circuit supplies the first binary value, and goes to the first binary value if said first logic circuit supplies the second binary value;

said second logic circuit supplies the selection signal precisely when said first and second inputs of said second logic circuit both receive the first binary value; and said changeover device can be temporarily changed over from the first switching state to the second switching state by an initialization pulse.

8. The addressing device according to claim 1, wherein the chosen bit combination of the M preselected reference bits is that which said reference bit transmitter supplies in an original state before a programming of said programmable links.

* * * * *